US012745547B2

(12) United States Patent
Yu et al.

(10) Patent No.: US 12,745,547 B2
(45) Date of Patent: Sep. 22, 2026

(54) DISPLAY DEVICE WITH A PLURALITY OF LIGHT EXTRACTION LAYERS

(71) Applicants: Yunnan Invensight Optoelectronics Technology Co., Ltd., Kunming (CN); BOE Technology Group Co., Ltd., Beijing (CN)

(72) Inventors: Hongtao Yu, Beijing (CN); Weiliang Bu, Beijing (CN); Yunhao Zhang, Beijing (CN); Dongdong Su, Beijing (CN); Yuhao Lee, Beijing (CN); Zongshun Yang, Beijing (CN); Hui Tong, Beijing (CN); Kuanta Huang, Beijing (CN); Xiaochuan Chen, Beijing (CN); Hui Wang, Beijing (CN); Fushuang Zhang, Beijing (CN); Chao Yang, Beijing (CN); Qinshan Cai, Beijing (CN); Lingang Wen, Beijing (CN)

(73) Assignees: Yunnan Invensight Optoelectronics Technology Co., Ltd., Yunnan (CN); BOE TECHNOLOGY GROUP CO., LTD., Beijing (CN)

( * ) Notice: Subject to any disclaimer, the term of this patent is extended or adjusted under 35 U.S.C. 154(b) by 609 days.

(21) Appl. No.: 18/028,043

(22) PCT Filed: Apr. 27, 2022

(86) PCT No.: PCT/CN2022/089588

§ 371 (c)(1),
(2) Date: Mar. 23, 2023

(87) PCT Pub. No.: WO2023/206147

PCT Pub. Date: Nov. 2, 2023

(65) Prior Publication Data

US 2024/0306476 A1 Sep. 12, 2024

(51) Int. Cl.
*H10K 59/80* (2023.01)
*H10K 59/38* (2023.01)

(52) U.S. Cl.
CPC .......... *H10K 59/879* (2023.02); *H10K 59/38* (2023.02)

(58) Field of Classification Search
CPC ..... H10K 59/38; H10K 59/879; H10K 50/858
See application file for complete search history.

(56) References Cited

U.S. PATENT DOCUMENTS

2003/0057417 A1 3/2003 Lee et al.
2003/0164679 A1 9/2003 Hamano et al.
(Continued)

FOREIGN PATENT DOCUMENTS

CN 102037580 A 4/2011
CN 102550126 A 7/2012
(Continued)

OTHER PUBLICATIONS

Application JP 2021-205519, foreign priority of US PGPub 2025/0057016 A1. (Year: 2021).*
(Continued)

*Primary Examiner* — Abdulmajeed Aziz
*Assistant Examiner* — Steven Y Horikoshi
(74) *Attorney, Agent, or Firm* — WHDA, LLP

(57) ABSTRACT

A display panel includes: a light-emitting baseplate including a plurality of light-emitting components arranged in array; a first light extraction layer located at a light-emitting side of the light-emitting baseplate and including a plurality of first light extraction patterns, orthographic projections of the plurality of first light extraction patterns on the light-emitting baseplate covering at least part area of the light-emitting components; a color filter layer including a plurality of filter patterns, orthographic projections of the plurality
(Continued)

of filter patterns on the light-emitting baseplate covering orthographic projections of the plurality of light-emitting components on the light-emitting baseplate; and a second light extraction layer including a plurality of second light extraction patterns, orthographic projections of the second light extraction patterns on the light-emitting baseplate being within the orthographic projections of the plurality of filter patterns on the light-emitting baseplate.

18 Claims, 5 Drawing Sheets

(56) References Cited

U.S. PATENT DOCUMENTS

2011/0073897 A1* 3/2011 Kang ................... H10K 50/858 257/98
2012/0175648 A1* 7/2012 Kasano ................ H10K 59/879 257/E33.073
2016/0104760 A1* 4/2016 Maeda ............. H10K 59/80522 438/34
2020/0006437 A1* 1/2020 Kim ....................... H10K 59/38
2020/0227669 A1 7/2020 Guo
2020/0358036 A1* 11/2020 Yokoyama ........... H10K 59/879
2021/0399264 A1* 12/2021 Ueda ...................... H10K 59/38
2022/0077431 A1* 3/2022 Lee ........................ H10K 59/40
2022/0131112 A1* 4/2022 Hinata ................. H10H 20/852
2022/0328794 A1 10/2022 Huang
2022/0407037 A1* 12/2022 Itonaga ................ H04N 9/3138
2025/0057016 A1* 2/2025 Uchida ................ H10K 50/818

FOREIGN PATENT DOCUMENTS

CN 107170789 A 9/2017
CN 110729413 A * 1/2020 ........... H10K 50/858
CN 111108602 A * 5/2020 ......... H10K 59/8792
CN 112840744 A 5/2021
CN 113241354 A 8/2021
JP 2004-047298 A 2/2004
WO 2022/080205 A1 4/2022

OTHER PUBLICATIONS

Machine translation of JP 2021-205519, via Google Translate on Aug. 4, 2025 (Year: 2025).*
Machine translation of CN 111108602 A, retrieved from worldwide.espacenet.com on Aug. 5, 2025 (Year: 2025).*
Machine translation of CN-110729413-A, retrieved from worldwide.espacenet.com on Jan. 20, 2026 (Year: 2026).*
Machine translation of CN-110729413-A, retrieved from worldwide.espacenet.com on May 4, 2026 (Year: 2026).*
Office Action dated Nov. 11, 2025, issued in counterpart Chinese patent application No. 202280000929.7 with English translation (20 pages).

* cited by examiner

DISPLAY DEVICE WITH A PLURALITY OF LIGHT EXTRACTION LAYERS

TECHNICAL FIELD

The present application relates to the technical field of displaying and more particularly, to a display panel and a display device.

BACKGROUND

OLED, also known as an organic light emitting diode, excites electrons in a light-emitting material by means of electric injection, and uses the electrons in the light-emitting material to return to the ground state for luminescence. Compared with other display devices, OLED has higher contrast, wider color gamut, shorter response time and can achieve ultra-thin flexibility.

SUMMARY

The embodiments of the present application employ the following technical solutions:

in the first aspect, the embodiment of the present application provides a display panel, including:

a light-emitting baseplate including a plurality of light-emitting components arranged in array;

a first light extraction layer, wherein the first light extraction layer is located at a light-emitting side of the light-emitting baseplate and includes a plurality of first light extraction patterns, orthographic projections of the plurality of first light extraction patterns on the light-emitting baseplate cover at least part area of the plurality of light-emitting components;

a color filter layer, wherein the color filter layer is located at a side of the first light extraction layer away from the light-emitting baseplate and includes a plurality of filter patterns, orthographic projections of the plurality of filter patterns on the light-emitting baseplate cover orthographic projections of the plurality of light-emitting components on the light-emitting baseplate; and a second light extraction layer, wherein the second light extraction layer is located at a side of the color filter layer away from the light-emitting baseplate and includes a plurality of second light extraction patterns, orthographic projections of the plurality of second light extraction patterns on the light-emitting baseplate are within the orthographic projections of the plurality of filter patterns on the light-emitting baseplate.

In some embodiments of the present application, in the plurality of first light extraction patterns, structures of at least part first light extraction patterns are different.

In some embodiments of the present application, the light-emitting baseplate includes a plurality of light-emitting units arranged in array, and each of the plurality of light-emitting units includes the plurality of light-emitting components; and structures of the first light extraction patterns located at a light-emitting side of a same light-emitting unit are different.

In some embodiments of the present application, the plurality of light-emitting units include first light-emitting components, second light-emitting components and third light-emitting components; and structures of the first light extraction patterns located at light-emitting sides of the first light-emitting components are the same, structures of the first light extraction patterns located at light-emitting sides of the second light-emitting components are the same, and structures of the first light extraction patterns located at light-emitting sides of the third light-emitting components are the same.

In some embodiments of the present application, shapes of section graphs of the first light extraction patterns located at the light-emitting side of the same light-emitting unit are different in a direction perpendicular to the light-emitting baseplate; and/or shapes of orthographic projection graphs on the light-emitting baseplate of the first light extraction patterns located at the light-emitting side of the same light-emitting unit are different.

In some embodiments of the present application, sizes of section graphs of the first light extraction patterns located at the light-emitting side of the same light-emitting unit are different in a direction perpendicular to the light-emitting baseplate; and/or sizes of orthographic projection graphs on the light-emitting baseplate of the first light extraction patterns located at the light-emitting side of the same light-emitting unit are different.

In some embodiments of the present application, the orthographic projections of the plurality of first light extraction patterns on the light-emitting baseplate cover the plurality of light-emitting components, and further cover at least part area between two adjacent light-emitting components.

In some embodiments of the present application, in a same direction, a spacing between every two adjacent first light extraction patterns is less than a spacing between every two adjacent second light extraction patterns.

In some embodiments of the present application, luminescent colors of the plurality of light-emitting components are the same, and the spacing between every two adjacent first light extraction patterns is zero.

In some embodiments of the present application, each of the plurality of first light extraction patterns includes at least one light regulating part, and each of the plurality of second light extraction patterns includes at least one convex lens; and a quantity of the at least one light regulating part of each of the plurality of first light extraction patterns is greater than or equal to a quantity of the at least one convex lens of each of the plurality of second light extraction patterns.

In some embodiments of the present application, each of the plurality of first light extraction patterns includes at least three light regulating parts, and sizes of at least part light regulating parts of a same light extraction pattern in a same direction are different.

In some embodiments of the present application, for the first light extraction pattern located at a light-emitting side of the light-emitting component, a size of projection shapes of the light regulating parts of the first light extraction pattern on the light-emitting baseplate in a direction is less than or equal to one third of a size of a projection shape of the light-emitting component on the light-emitting baseplate in the same direction.

In some embodiments of the present application, each of the plurality of first light extraction patterns includes a first surface, the first surface is disposed away from the light-emitting baseplate; and the first surface includes a surface formed by a combination of a plurality of curve surfaces or a surface formed by a combination of a plurality of planes.

In some embodiments of the present application, the at least one light regulating part includes a combination of one or more of a semi-ellipsoid, a hemisphere and a triangular pyramid.

In some embodiments of the present application, the display panel further includes a first fill layer, the first fill layer is located between the first light extraction layer and the color filter layer, a refractive index of a material of the first light extraction layer is greater than a refractive index of a material of the first fill layer, and an absolute value of a difference between the two refractive indexes is greater than or equal to 0.5.

In some embodiments of the present application, a refractive index of a material of the first light extraction layer is greater than a refractive index of a material of the second light extraction layer, and an absolute value of a difference between the two refractive indexes is greater than or equal to 0.5.

In some embodiments of the present application, the light-emitting baseplate includes an encapsulation layer covering the plurality of light-emitting components, an isolation layer located at a side of the encapsulation layer away from the plurality of light-emitting components; a refractive index of a material of the encapsulation layer is greater than a refractive index of a material of the isolation layer, and the refractive index of the material of the encapsulation layer is greater than a refractive index of a material of the first light extraction layer.

In some embodiments of the present application, an absolute value of a difference between the refractive index of the material of the encapsulation layer and the refractive index of the material of the first light extraction layer is less than or equal to 0.01, and an absolute value of a difference between a transmittance of the material of the encapsulation layer and a transmittance of the material of the first light extraction layer is less than or equal to 1%.

In some embodiments of the present application, the display panel further includes a second fill layer and a protective layer, the second fill layer is located between the second light extraction layer and the color filter layer, the protective layer covers the second light extraction layer, and a refractive index of a material of the second light extraction layer is greater than a refractive index of a material of the protective layer.

In the second aspect, an embodiment of the present application provides a display device, including the above display panel.

The above description is merely a summary of the technical solutions of the present application. In order to more clearly know the technological means of the present application to enable the implementation according to the contents of the description, and in order to make the above and other purposes, features and advantages of the present application more apparent and understandable, the particular embodiments of the present application are provided below.

BRIEF DESCRIPTION OF THE DRAWINGS

In order to more clearly illustrate the technical solutions of the embodiments of the present application or the related art, the drawings that are required to describe the embodiments or the related art will be briefly described below. Apparently, the drawings that are described below are merely embodiments of the present application, and a person skilled in the art may obtain other drawings according to these drawings without paying creative work.

DETAILED DESCRIPTION

Figure 1:
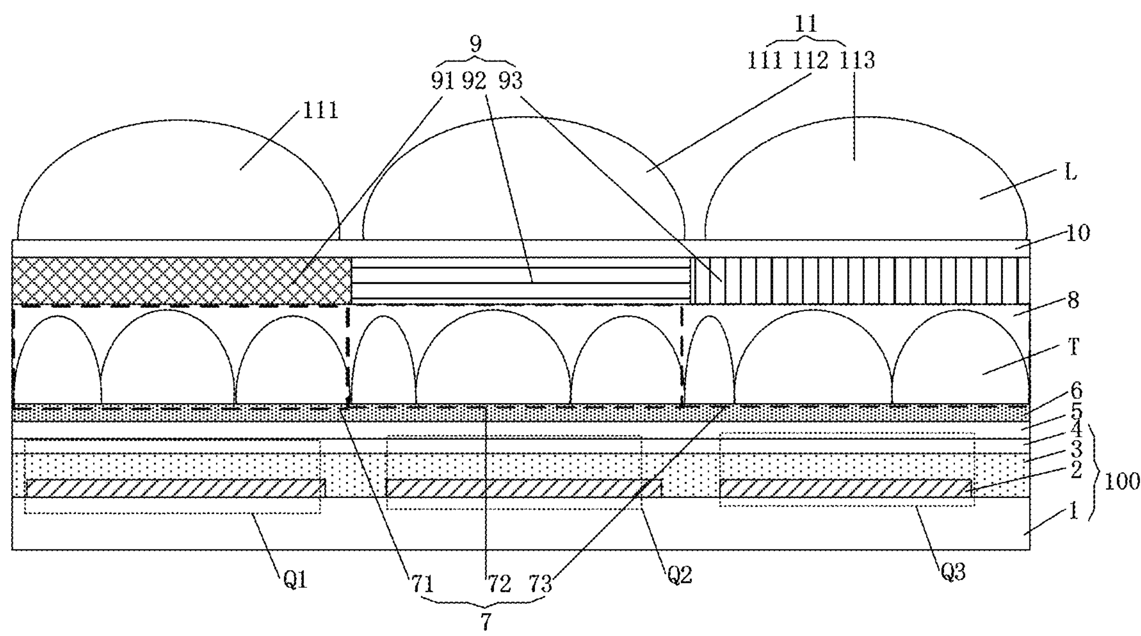
FIG. 1 to FIG. 4 are schematic structural diagrams of four display panel according to the embodiments of the present application.

The following will give a clear and complete description of the technical solution in the embodiments of the present application in combination with the drawings in the embodiments of the present application. Obviously, the described embodiments are only part of the embodiments of the present application, not all of them. Based on the embodiments in the present application, all other embodiments obtained by ordinary technicians in the art without creative work fall within the scope of protection in the present application.

In the drawings, the thicknesses of the areas and layers may be exaggerated for clarity. The same reference numerals in the drawings represent the same or similar structures, so their detailed description will be omitted. In addition, the attached drawings are only schematic diagrams of the present disclosure and are not necessarily drawn to scale.

In the embodiment of the present application, unless otherwise stated, "a plurality of" means two or more. The orientation or position relationship indicated by the term "up" is based on the orientation or position relationship shown in the attached drawings, which is only for the convenience of describing the application and simplifying the description, but not for indicating or implying that the structure or element referred to must have a specific orientation, structure and operation in a specific orientation, so it cannot be understood as a restriction on the present application.

Unless the context otherwise requires, the term "including/comprising" is interpreted as "including, but not limited to" in the entire specification and claims. In the description of the specification, the terms "one embodiment", "some embodiments", "exemplary embodiments", "examples", "specific examples" or "some examples" are intended to indicate that specific features, structures, materials or characteristics related to the embodiment or example are included in at least one embodiment or example of the present application. The schematic representation of the above terms does not necessarily refer to the same embodiment or example. In addition, the specific features, structures, materials or features described may be included in any one or more embodiments or examples in any appropriate manner.

In the embodiment of the present application, the words "first", "second" and other words are used to distinguish the same or similar items with basically the same function and action, only for the purpose of clearly describing the technical solution of the embodiment of the present application, and cannot be understood as indicating or implying the relative importance or implying the quantity of the indicated technical features.

Organic light emitting diode (OLED) display products include glass-based OLED products and silicon-based OLED products. The structures of the driving backplanes used by the two products are different. The glass-based OLED products prepare the driving circuit on the glass substrate, while the silicon-based OLED products prepare the driving circuit on the silicon substrate (Wafer). Among them, silicon-based OLED display is also called micro organic light emitting diode (Micro-OLED) micro display. In related art, in order to improve the light emitting efficiency of the OLED display products, a Micro-Lens (micro lens) structure is generally set in the OLED display products to improve the brightness of the products. However, due to the structure of the micro lens, and characters of the refractive index and transmittance of micro lens materials, the brightness gain coefficient is mostly around 1.5~2. With the increasing demand for brightness of micro-displays in the market, it is necessary to seek new processes or methods to improve the brightness gain coefficient and thus improving the light utilization.

Figure 2:
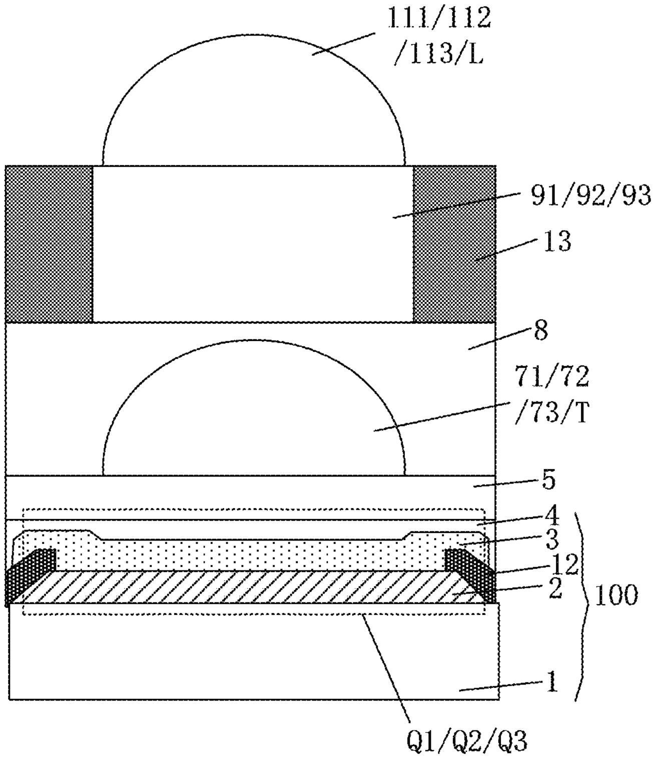

Based on this, the embodiment of the present application provides a display panel, referring to FIG. 1 and FIG. 2, including:

- a light-emitting baseplate 100 including a plurality of light-emitting components arranged in array, such as the light-emitting component Q1, the light-emitting component Q2 and the light-emitting component Q3;
- a first light extraction layer 7, wherein the first light extraction layer 7 is located at a light-emitting side of the light-emitting baseplate 100 and includes a plurality of first light extraction patterns, such as the first light extraction pattern 71, the first light extraction pattern 72 and the first light extraction pattern 73, orthographic projections of the plurality of first light extraction patterns on the light-emitting baseplate 100 cover at least part area of the plurality of light-emitting components;
- a color filter layer 9, wherein the color filter layer 9 is located at a side of the first light extraction layer 7 away from the light-emitting baseplate 100 and includes a plurality of filter patterns, such as the filter pattern 91, the filter pattern 92 and the filter pattern 93, orthographic projections of the plurality of filter patterns on the light-emitting baseplate cover orthographic projections of the plurality of light-emitting components on the light-emitting baseplate; and
- a second light extraction layer 11, wherein the second light extraction layer 11 is located at a side of the color filter layer 9 away from the light-emitting baseplate 100 and includes a plurality of second light extraction patterns, such as the second light extraction pattern 111, the second light extraction pattern 112 and the second light extraction pattern 113, orthographic projections of the plurality of second light extraction patterns on the light-emitting baseplate 100 are within the orthographic projections of the plurality of filter patterns on the light-emitting baseplate 100.

The specific structure of the above light-emitting baseplate 100 is not limited here, but can be determined according to the actual situation.

For example, the above light-emitting baseplate 100 may be a glass-based light-emitting baseplate, or the above light-emitting baseplate 100 may be a silicon-based light-emitting baseplate.

The glass-based light-emitting baseplate includes a driving circuit arranged on the glass substrate and a plurality of light-emitting components electrically connected to the driving circuit. The silicon-based light-emitting baseplate includes a driving circuit arranged on the silicon substrate and a plurality of light-emitting components electrically connected to the driving circuit. In practical applications, the drive circuit in the glass-based light-emitting baseplate is different from that in the silicon-based light-emitting baseplate. For details, which may refer to related art and are not limited here.

The light-emitting components may include the first light-emitting component Q1, the second light-emitting component Q2 and the third light-emitting component Q3. In some embodiments, luminescent colors of the first light-emitting component Q1, the second light-emitting component Q2 and the third light-emitting component Q3 may be the same. In some embodiments, the luminescent colors of the first light-emitting component Q1, the second light-emitting component Q2 and the third light-emitting component Q3 may be different. The embodiments of the present application takes the luminescent colors of the first light-emitting component Q1, the second light-emitting component Q2 and the third light-emitting component Q3 being the same as an example to illustrate.

The specific structures of the light-emitting components are not limited here, but can be determined according to the actual situation.

For example, each of the light-emitting components includes a first electrode, a luminescent layer, a second electrode, and an encapsulation layer. As shown in FIG. 1, the first electrodes 2 of the light-emitting components are set separately, light-emitting functional layers of the light-emitting components are connected together to form a light-emitting film 3, and the second electrodes of the light-emitting components are connected together to form an electrode layer film 4, the encapsulation layers of the light-emitting components are connected to form the encapsulation layer film 5. The first electrode may be the anode and the second electrode may be the cathode. As shown in FIG. 2, the light-emitting layers of the light-emitting components may be set separately, and a pixel definition layer 12 is also set between the light-emitting layers of two adjacent light-emitting components.

In the exemplary embodiment, the orthographic projections of the plurality of first light extraction patterns on the light-emitting baseplate 100 cover at least part area of the plurality of light-emitting components, including but not limited to the following cases, taking the first light extraction pattern 71 and the first light-emitting component Q1 as examples.

The first case is that: the orthographic projection of the first light extraction pattern 71 on the light-emitting baseplate 100 covers a part area of the light-emitting component Q1. For example, the light-emitting component Q1 includes a middle area and a peripheral area surrounding the middle area, and the orthographic projection of the first light extraction pattern 71 on the light-emitting baseplate 100 covers the middle area of the light-emitting component Q1;

- the second case is that: the orthographic projection of the first light extraction pattern 71 on the light-emitting baseplate 100 covers the whole area of the light-emitting component Q1; and
- the third case is that: the orthographic projection of the first light extraction pattern 71 on the light-emitting baseplate 100 covers the whole area of the light-emitting component Q1, and also covers at least part of the area between the two adjacent first light extraction patterns.

In an exemplary embodiment, the color filter layer 9 includes the plurality of filter patterns, such as the filter pattern 91, the filter pattern 92 and the filter pattern 93.

Among them, the filter pattern 91, the filter pattern 92 and the filter pattern 93 have different colors.

For example, the filter pattern 91 is a red color-resistance pattern, the filter pattern 92 is a green color-resistance pattern, and the filter pattern 93 is a blue color-resistance pattern. In some embodiments, the light emitted by the light-emitting component may be converted into red light after passing through the filter pattern 91, the light emitted by the light-emitting component may be converted into green light after passing through the filter pattern 92, and the light emitted by the light-emitting component may be converted into blue light after passing through the filter pattern 93.

In an exemplary embodiment, in the filter pattern 91, the filter pattern 92 and the filter pattern 93, a black matrix layer may be set between any two adjacent filter patterns to play a role of shading, so as to avoid cross-color of the color-resistance patterns with different colors.

In some embodiments, superimposed color-resistance patterns may be used as shading layers to avoid color mixing of the color-resistance patterns with different colors.

Figure 3:
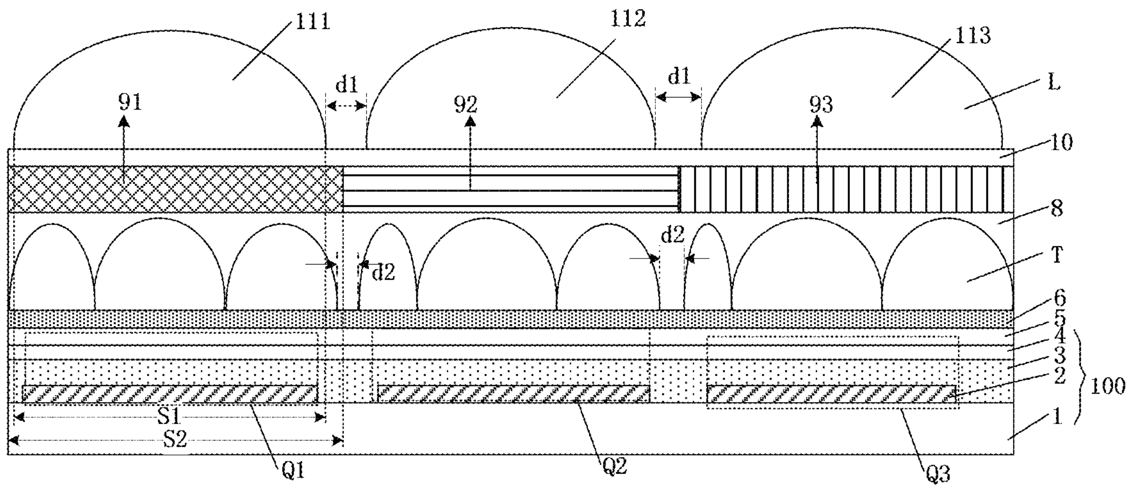

The orthographic projections of the plurality of second light extraction patterns on the light-emitting baseplate 100 are within the orthographic projections of the plurality of filter patterns on the light-emitting baseplate 100, including but not limited to the following:

the first case is that, as shown in FIG. 3, an outer contour S1 of the orthographic projections of the second light extraction patterns on the light-emitting baseplate 100 is located within an outer contour S2 of the orthographic projections of the plurality of filter patterns on the light-emitting baseplate 100.

The second case is that, the outer contour of the orthographic projections of the second light extraction patterns on the light-emitting baseplate 100 overlaps with the outer contour of the orthographic projections of the plurality of filter patterns on the light-emitting baseplate 100.

It should be noted that, no matter in the first case or the second case, there is no overlap between two adjacent second light extraction patterns, or there is no contact between the two adjacent second light extraction patterns.

For example, there is a gap between the two adjacent second light extraction patterns.

In the embodiment of the present application, the light emitted by the light-emitting components in the light-emitting baseplate 100 is refracted by setting the first light extraction layer 7 on the light-emitting side of the light-emitting baseplate 100, to reduce the total reflection in the film layer, so that the light emitted by the light-emitting components may be emitted by the first light extraction layer 7 as much as possible. In addition, the second light extraction layer 11 is set on the light-emitting side of the color filter layer 9. Through the second light extraction layer 11, the light emitted by the color filter layer 9 is further converged, thus reducing the amount of the light emitted from the direction parallel to the light-emitting baseplate, improving the efficiency of the light emitted from the direction perpendicular to the light-emitting baseplate, and improving the display effect of the display panel.

In some embodiments of the present application, in all first light extraction patterns, structures of at least part first light extraction patterns are different.

The structures are different, which includes but are not limited to the following cases: the projection shapes of the orthographic projections of the first light extraction patterns on the light-emitting baseplate are different; the projection shapes of the orthographic projections of the first light extraction patterns on the light-emitting baseplate are the same, but the projection sizes are different; the sectional shapes of the first light extraction patterns are different along the direction perpendicular to the light-emitting baseplate; and the sectional shapes of the first light extraction patterns are the same along the direction perpendicular to the light-emitting baseplate, but the sectional sizes are different.

In the embodiment of the present application, in all first light extraction patterns, structures of at least part first light extraction patterns are different, which means that all the first light extraction patterns are not completely the same, in which, not completely the same is relative to completely the same, and the cases included in the embodiment of the present application are all the cases except the case of completely the same.

In the display panel provided by the embodiment of the present application, by setting all the first light extraction patterns in the first light extraction layer 7 to be not completely the same (disordered), while improving the light utilization, it avoids the uneven display in the display panel caused by the optical effect of the first light extraction layer 7 with the regular structure, such as the periodic light and dark Mura problem, and improves the display effect of the display panel.

In some embodiments of the present application, the light-emitting baseplate includes a plurality of light-emitting units arranged in array, and each of the plurality of light-emitting units includes the plurality of light-emitting components; and structures of the first light extraction patterns located at a light-emitting side of a same light-emitting unit are different.

In some embodiments of the present application, shapes of section graphs of the first light extraction patterns located at the light-emitting side of the same light-emitting unit are different in a direction perpendicular to the light-emitting baseplate; and/or, shapes of orthographic projection graphs on the light-emitting baseplate of the first light extraction patterns located at the light-emitting side of the same light-emitting unit are different.

In some embodiments of the present application, sizes of the section graphs of the first light extraction patterns located at the light-emitting side of the same light-emitting unit are different in the direction perpendicular to the light-emitting baseplate; and/or, sizes of the orthographic projection graphs on the light-emitting baseplate of the first light extraction patterns located at the light-emitting side of the same light-emitting unit are different.

The structures of the first light extraction patterns located at a light-emitting side of a same light-emitting unit are different, which includes but are not limited to the following cases:

in the first case, the shapes of the section graphs of the first light extraction patterns located at the light-emitting side of the same light-emitting unit are different in the direction perpendicular to the light-emitting baseplate;

in the second case, the shapes of the orthographic projection graphs on the light-emitting baseplate of the first light extraction patterns located at the light-emitting side of the same light-emitting unit are different;

in the third case, the shapes of the section graphs of the first light extraction patterns located at the light-emitting side of the same light-emitting unit are different in the direction perpendicular to the light-emitting baseplate, and the shapes of the orthographic projection graphs on the light-emitting baseplate of the first light extraction patterns located at the light-emitting side of the same light-emitting unit are different;

in the fourth case, the sizes of the section graphs of the first light extraction patterns located at the light-emitting side of the same light-emitting unit are different in the direction perpendicular to the light-emitting baseplate;

in the fifth case, the sizes of the orthographic projection graphs on the light-emitting baseplate of the first light extraction patterns located at the light-emitting side of the same light-emitting unit are different;

in the sixth case, the sizes of the section graphs of the first light extraction patterns located at the light-emitting side of the same light-emitting unit are different in the direction perpendicular to the light-emitting baseplate, and the sizes of the orthographic projection graphs on the light-emitting baseplate of the first light extraction patterns located at the light-emitting side of the same light-emitting unit are different.

Figure 4:
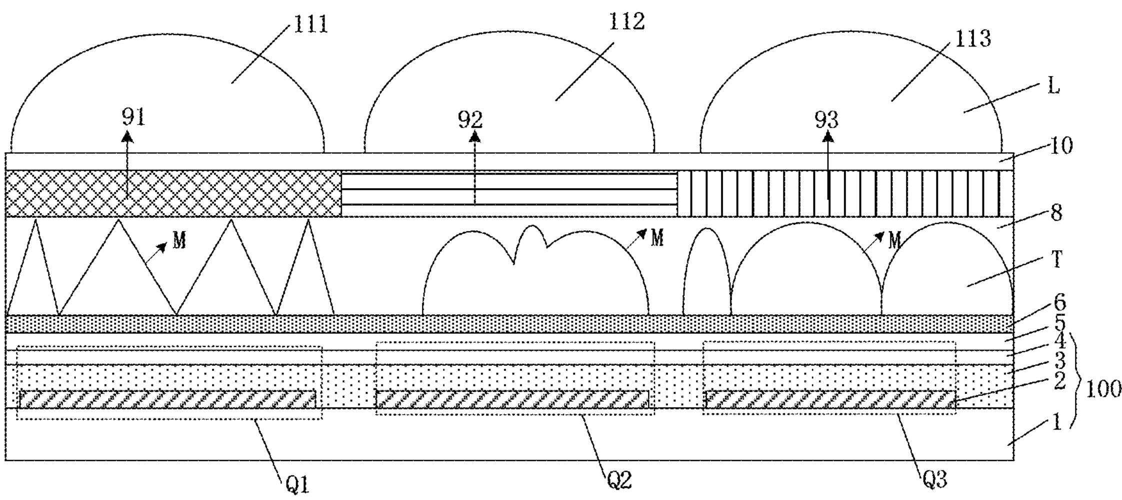

In an exemplary embodiment, referring to FIG. 3 and FIG. 4, each of the plurality of light-emitting units includes a first light-emitting component Q1, a second light-emitting component Q2 and a third light-emitting component Q3; the first light extraction pattern 71 is disposed at a light-emitting side of the first light-emitting component Q1, the first light extraction pattern 72 is disposed at a light-emitting side of the second light-emitting component Q2, and the first light extraction pattern 73 is disposed at a light-emitting side of the third light-emitting component Q3.

In FIG. 3, structures of the first light extraction pattern 71, the first light extraction pattern 72 and the first light extraction pattern 73 are different. In some embodiments of the present application, the first light extraction pattern 71, the first light extraction pattern 72 and the first light extraction pattern 73 include three light regulating parts T, respectively, in which, a sectional size of the three light regulating parts T of the first light extraction pattern 71 in the direction perpendicular to the light-emitting baseplate 100, a sectional size of the three light regulating parts T of the first light extraction pattern 72 in the direction perpendicular to the light-emitting baseplate 100 and a sectional size of the three light regulating parts T of the first light extraction pattern 73 in the direction perpendicular to the light-emitting baseplate 100 are different.

In FIG. 4, the structures of the first light extraction pattern 71, the first light extraction pattern 72 and the first light extraction pattern 73 are different. In some embodiments of the present application, a sectional shape of the first light extraction pattern 71 in the direction perpendicular to the light-emitting baseplate 100, a sectional shape of the first light extraction pattern 72 in the direction perpendicular to the light-emitting baseplate 100 and a sectional shape of the first light extraction pattern 73 in the direction perpendicular to the light-emitting baseplate 100 are all different.

In some embodiments of the present application, the plurality of light-emitting units include first light-emitting components Q1, second light-emitting components Q2 and third light-emitting components Q3; and the structures of the first light extraction patterns located at light-emitting sides of the first light-emitting components Q1 are the same, the structures of the first light extraction patterns located at light-emitting sides of the second light-emitting components Q2 are the same, and the structures of the first light extraction patterns located at light-emitting sides of the third light-emitting components Q3 are the same.

In practical applications, the light emitted by the first light-emitting components Q1 is emitted after passing through the first light extraction patterns and the filter patterns in turn. It can be understood that the structures of the first light extraction patterns between the first light-emitting component Q1 and the filter pattern 91 are the same. the structures of the first light extraction patterns between the second light-emitting component Q2 and the filter pattern 92 are the same, and the structures of the first light extraction patterns between the third light-emitting component Q3 and the filter pattern 93 are the same.

In some embodiments of the present application, the orthographic projections of the first light extraction patterns on the light-emitting baseplate cover the light-emitting components, and also cover at least part of the area between the two adjacent light-emitting components.

In the exemplary embodiment, in order to increase the amount of light entering the first light extraction pattern as much as possible, it sets the orthographic projections of the first light extraction patterns on the light-emitting baseplate to cover the light-emitting components, and also sets the orthographic projections of the first light extraction patterns on the light-emitting baseplate to cover at least part of the area between the two adjacent light-emitting components. In this way, when the light emitted by the light-emitting components is emitted from the direction parallel to the light-emitting baseplate and refracted in the encapsulation layer 5, the first light extraction patterns may change the propagation path of this part of light, and make it emit into the color filter layer after passing through the first light extraction layer, thus improving the light utilization.

In an exemplary embodiment, a gap may be set between two adjacent first light extraction patterns.

For example, the smaller the size of the gap, the better it is for the first light extraction patterns to extract more lights.

In some embodiments of the present application, refer to FIG. 3, in a same direction, a spacing d2 between every two adjacent first light extraction patterns is less than a spacing d1 between every two adjacent second light extraction patterns.

In an exemplary embodiment, because the colors of the filter pattern 91, the filter pattern 92 and the filter pattern 93 are different. For example, the light emitted by the light-emitting components may be converted into red light after passing through the filter pattern 91, and the light emitted by the light-emitting components may be converted into green light after passing through the filter pattern 92, the light emitted by the light-emitting components may be converted into blue light after passing through the filter pattern 93. When setting the second light extraction patterns, in order to avoid the crosstalk of lights with different colors, there is no contact between the two adjacent second light extraction patterns.

In an exemplary embodiment, a gap is set between two adjacent second light extraction patterns.

The size of the gap between the two adjacent second light extraction patterns is not limited here, which may be determined according to the structural design of the display panel and the material characteristics of the second light extraction patterns.

In some embodiments of the present application, in the case that luminescent colors of the plurality of light-emitting components are different, there is a gap between each two adjacent first light extraction patterns to avoid color mixing of different colors of the lights.

In some embodiments of the present application, refer to FIG. 1, in the case that luminescent colors of the plurality of light-emitting components are the same, the spacing between every two adjacent first light extraction patterns is zero.

The spacing being zero is equivalent to that two adjacent first light extraction patters contact each other.

In the embodiment of the present application, by setting the two adjacent first light extraction patterns contacting each other, the luminescent efficiency of the light-emitting components may be improved to the maximum extent, thereby improving the brightness of the display panel, improving the display effect, and reducing the energy consumption.

Figure 8:
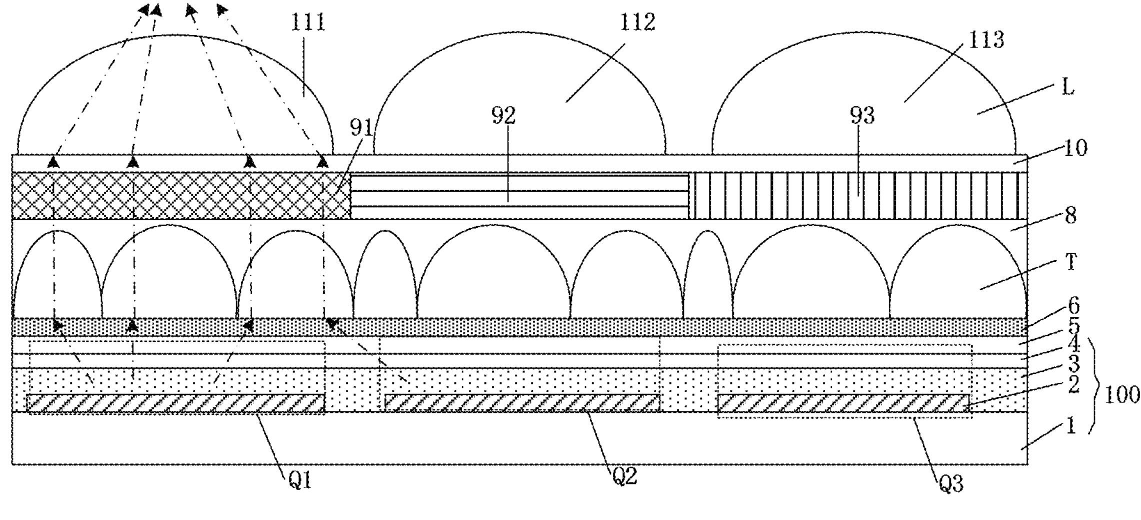
FIG. 8 is a schematic diagram of a light path according to an embodiment of the present application.

FIG. 8 shows a schematic structural diagram of a display panel with two adjacent first light extraction patterns contacting each other, in which all light-emitting components in the display panel have the same luminescent color. When the light emitted by the light-emitting components enters the light regulating part T of the first light extraction pattern from different angles, since there is no spacing (the spacing is zero) between the two adjacent first light extraction patterns, each light regulating part converges the lights from different directions (dotted arrows) and emits as much as possible. The light emitted by the first light extraction pattern and entering the filter patterns (91, 92, 93) has a slight refraction and scattering effect and further enters the second light extraction pattern. The second light extraction pattern further converges and emits the light, thus gathering the light with a large angle of view, reducing the loss of the light with the large angle of view, improving the brightness of the light emitted from a positive angle of view, and improving the light utilization.

It should be noted that the influence of refraction and scattering in the filter patterns on the light path is significantly less than the influence of first light extraction patterns and the second light extraction patterns on the light path, so the influence of the filter patterns on the light path is not reflected in the light path in FIG. 8.

In some embodiments of the present application, refer to FIG. 1 or FIG. 4, each of the plurality of first light extraction patterns includes at least one light regulating part T, and each of the plurality of second light extraction patterns includes at least one convex lens L; and a quantity of the at least one light regulating part T of each of the plurality of first light extraction patterns is greater than or equal to a quantity of the at least one convex lens L of each of the plurality of second light extraction patterns.

In an exemplary embodiment, by setting the quantity of the light regulating parts T in the first light extraction pattern to be greater than or equal to the quantity of the convex lens L in the second light extraction pattern, the area of the interface where refraction occurs in the first light extraction pattern is increased. The first light extraction pattern can take out as many lights as possible and inject them into the filter pattern while converging the lights. When the light emitted by the filter pattern enters the second light extraction pattern, the second light extraction pattern have a stronger light convergence ability, which gathers the light of the large angle of view, improves the brightness of the light emitted from the positive angle of view of the display panel, and improves the light utilization.

In some embodiments of the present application, the second light extraction pattern include one convex lens. The projection of the focus of the convex lens on the first light extraction pattern is in the central area of the first light extraction pattern. In this way, it can further improve the probability of the light emitted by the filter pattern entering the second light extraction pattern, improve the light convergence ability of the second light extraction pattern, improve the brightness of the light emitted from the positive angle of view of the display panel, and then improve the light utilization.

In some embodiments of the present application, referring to FIG. 3, each of the plurality of first light extraction patterns includes at least three light regulating parts T, and sizes of at least part light regulating parts T of a same light extraction pattern in a same direction are different.

In the embodiment of the present application, by setting sizes of at least part light regulating parts T of a same light extraction pattern in a same direction being different, it avoids the uneven display in the display panel caused by the optical effect of the first light extraction layer 7 with the regular structure, such as the periodic light and dark Mura problem, and improves the display effect of the display panel.

In some embodiments of the present application, for the first light extraction pattern located at a light-emitting side of the light-emitting component, a size of projection shapes of the light regulating parts of the first light extraction pattern on the light-emitting baseplate in a direction is less than or equal to one third of a size of a projection shape of the light-emitting component on the light-emitting baseplate in the same direction.

In some embodiments of the present application, referring to FIG. 4, each of the plurality of first light extraction patterns includes a first surface M, the first surface is disposed away from the light-emitting baseplate 100; and the first surface includes a surface formed by a combination of a plurality of curve surfaces or a surface formed by a combination of a plurality of planes.

In some embodiments of the present application, the light regulating part T includes a combination of one or more of a semi-ellipsoid, a hemisphere and a triangular pyramid.

In an exemplary embodiment, the surfaces of the light regulating parts T in the first light extraction pattern that is far away from the light-emitting baseplate 100 form the first surface.

In some embodiments of the present application, the display panel further includes a first fill layer 8, the first fill layer 8 is located between the first light extraction layer 7 and the color filter layer 9, a refractive index of a material of the first light extraction layer 7 is greater than a refractive index of a material of the first fill layer 8, and an absolute value of a difference between the two refractive indexes is greater than or equal to 0.5.

In an exemplary embodiment, the material of the first light extraction layer 7 may be inorganic materials or organic materials.

For example, the inorganic material may include at least one of silicon nitride, silicon oxide and silicon oxynitride.

For example, the organic material may include acrylic resin.

In the embodiment of the present application, by setting the refractive index of the material of the first light extraction layer 7 being greater than the refractive index of the material of the first fill layer 8, and the absolute value of the difference between the two refractive indexes being greater than or equal to 0.5, the refractive effect between the interfaces of the first light extraction layer 7 and the first fill layer 8 may be further improved, and the light extraction efficiency of the first light extraction layer 7 may be improved, thus improving the display effect of the display panel.

In some embodiments of the present application, the refractive index of the material of the first light extraction layer is greater than a refractive index of a material of the second light extraction layer, and an absolute value of a difference between the two refractive indexes is greater than or equal to 0.5.

In some embodiments of the present application, referring to FIG. 3, the light-emitting baseplate includes an encapsulation layer 5 covering the plurality of light-emitting components, an isolation layer 6 located at a side of the encapsulation layer 5 away from the plurality of light-emitting components; a refractive index of a material of the encapsulation layer 5 is greater than a refractive index of a material of the isolation layer 6, and the refractive index of the material of the encapsulation layer 5 is greater than the refractive index of the material of the first light extraction layer 7.

In an exemplary embodiment, the encapsulation layer 5 includes an inorganic sub-layer, an organic sub-layer and an inorganic sub-layer arranged successively in stacked, in which the material of the inorganic sub-layer includes inorganic non-metallic materials, such as at least one of silicon nitride, silicon oxide and silicon oxynitride, and the material of the organic sub-layer includes transparent resin, such as acrylic resin.

In an exemplary embodiment, the material of the first light extraction layer 7 includes at least one of silicon nitride, silicon oxide and silicon oxynitride.

In an exemplary embodiment, the material of the isolation layer 6 includes metal oxides, such as aluminum oxide.

In the embodiment of the present application, the isolation layer 6 is set between the encapsulation layer 5 and the first light extraction layer 7 to avoid direct contact between the first light extraction layer 7 and the inorganic sub-layer in the encapsulation layer 5, so as to avoid the influence of the inorganic materials in the inorganic sub-layer on the first light extraction layer 7 material in the process of preparing the first light extraction layer 7. In addition, it can improve the yield of the first light extraction layer 7, thus helping to improve the reliability of the display panel.

In some embodiments of the present application, an absolute value of a difference between the refractive index of the material of the encapsulation layer 5 and the refractive index of the material of the first light extraction layer 7 is less than or equal to 0.01, and an absolute value of a difference between a transmittance of the material of the encapsulation layer 5 and a transmittance of the material of the first light extraction layer 7 is less than or equal to 1%.

In an exemplary embodiment, the refractive index of the material of the isolation layer 6 is greater than or equal to the refractive index of the material of the first light extraction layer 7, and less than or equal to the refractive index of the material of the encapsulation layer 5.

In the embodiment of the present application, the optical extraction efficiency of the first light extraction layer 7 may be further improved by setting the absolute value of the difference between the refractive index of the material of the encapsulation layer 5 and the refractive index of the material of the first light extraction layer 7 to be less than or equal to 0.01, and the absolute value of the difference between the transmittance of the material of the encapsulation layer 7 and the transmittance of the material of the first light extraction layer 7 to be less than or equal to 1%, which may reduce the light loss in the process of light propagation, so as to improve the brightness of the light emitted from the positive angle of view of the display panel and improve the light utilization.

Figure 9:
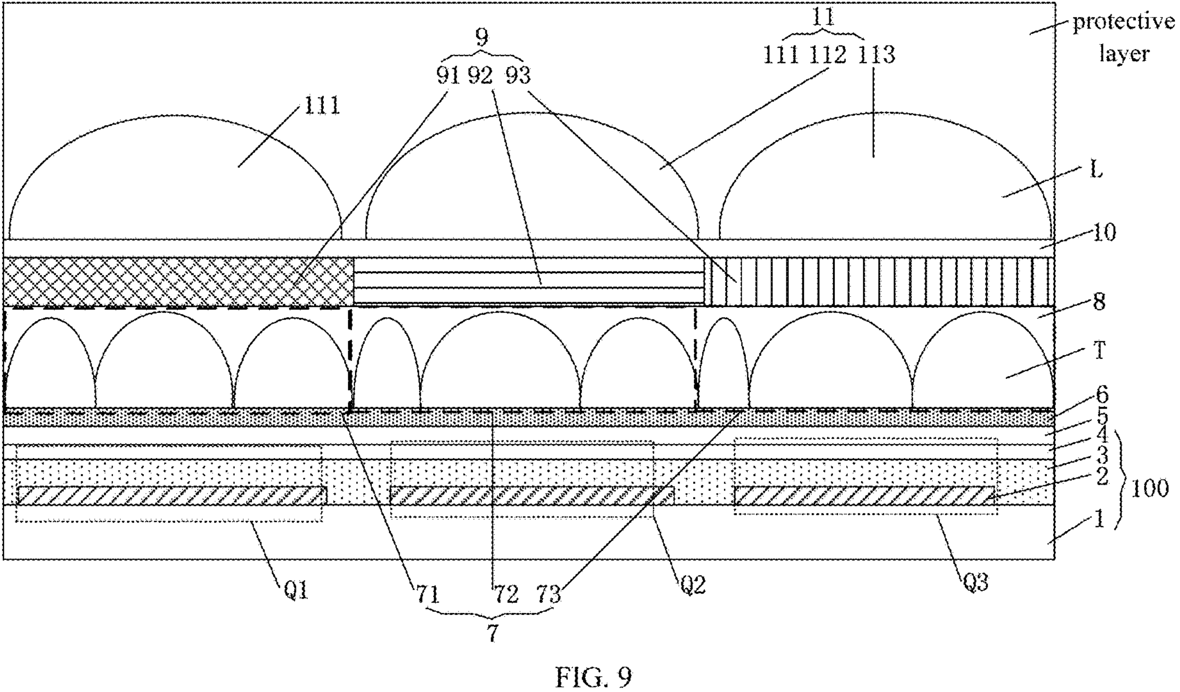
FIG. 9 is a schematic diagram of a protective layer according to an embodiment of the present application.

In some embodiments of the present application, referring to FIGS. 1 and 9, the display panel further includes a second fill layer 10 and a protective layer, the second fill layer 10 is located between the second light extraction layer 11 and the color filter layer 9, the protective layer covers the second light extraction layer 11, and a refractive index of a material of the second light extraction layer 11 is greater than a refractive index of a material of the protective layer.

In the exemplary embodiment, the second fill layer 10 is set between the second light extraction layer 11 and the color filter layer 9. On the one hand, it may play a role of planarization, which is conducive to the preparation of the second light extraction layer 11 in the subsequent process. On the other hand, it may protect the color filter layer 9 to a certain extent and avoid damage to the color filter layer 9 in the subsequent process of preparing the second light extraction layer 11.

The embodiment of the present application provides a display device, including the display panel described above.

The specific structure of the display panel included in the above display device may refer to the previous description, which will not be repeated here. The display device also includes a drive IC for driving the display panel and a power supply circuit for power supply. The display device may also include other structures and components. Other structures and components included in the display device may refer to related art, which are not limited here.

The display device may be a display component such as an OLED display and any product or component with display functions such as a TV, a digital camera, a mobile phone, a tablet computer, etc., including these display components.

In the display device provided in the embodiment of the present application, the light emitted by the light-emitting components in the light-emitting baseplate 100 is refracted by setting the first light extraction layer 7 on the light-emitting side of the light-emitting baseplate 100 to reduce the total reflection in the film layers, so that the light emitted by the light-emitting components may be emitted by the first light extraction layer 7 as much as possible. In addition, the second light extraction layer 11 is set on the light-emitting side of the color filter layer 9. Through the second light extraction layer 11, the light emitted by the color filter layer 9 is further converged, thus reducing the amount of the light emitted from the direction parallel to the light-emitting baseplate, improving the efficiency of the light emitted from the direction perpendicular to the light-emitting baseplate, and improving the display effect of the display panel.

The embodiment of the present application also provides a preparation method of a display panel, which includes:

S01, providing a backplane;

in an exemplary embodiment, the backplane may be a glass-based backplane, or the backplane may be a silicon-based backplane, and the backplane includes a drive circuit for driving light-emitting components to emit light.

Figure 5:
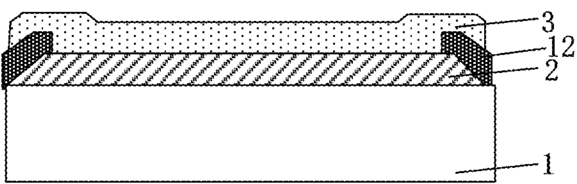
FIG. 5 to FIG. 7 are schematic diagrams of three intermediate structures in the preparation process of the display panel according to the embodiments of the present application.

The backplane also includes a first pole as shown in FIG. 5, such as an anode 2, and a pixel definition layer 12.

Figure 6:
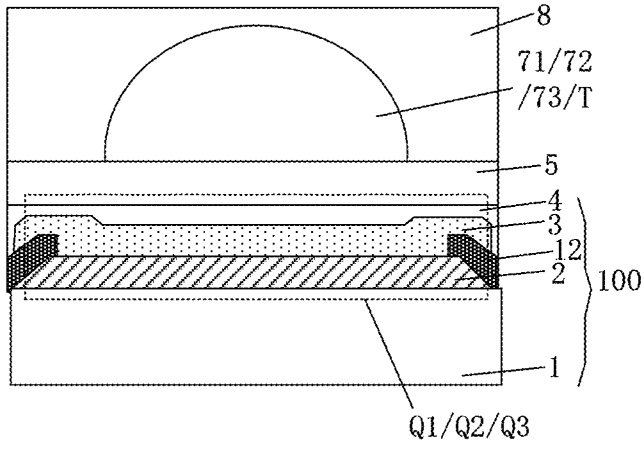
Figure 7:
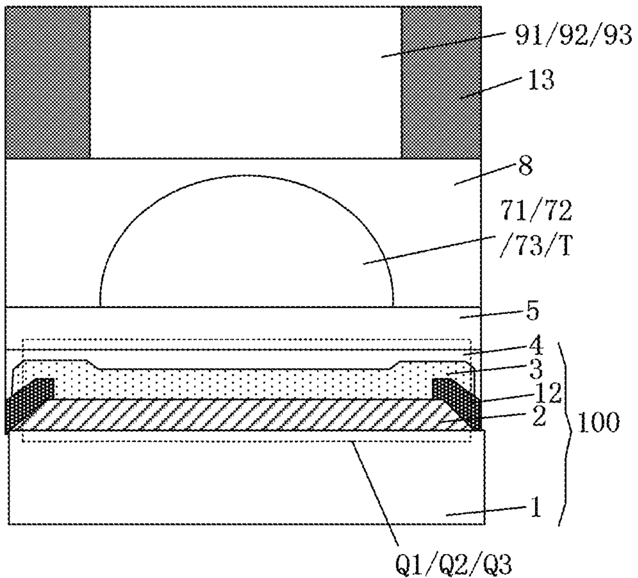

S02, forming a light-emitting functional layer and a cathode of the light-emitting component as shown in FIG. 6;

among them, the light-emitting component includes the anode, the light-emitting functional layer and the cathode. The light-emitting baseplate 100 in FIG. 5 includes the backplane, the light-emitting functional layer of the light-emitting component and the cathode;

for example, the light-emitting functional layer may include a plurality of film layers, such as: a hole injection layer (HIL layer), a hole transport layer (HTL layer), an organic transition buffer layer (Prime layer), a light-emitting layer (EML layer), a hole barrier layer (HBL layer) and an electron injection layer.

For example, the light-emitting function layers of the light-emitting components may be set separately. Alternatively, the light-emitting functional layers of the light-emitting components are connected together.

It should be noted that, the light-emitting function layers of the light-emitting components are set separately when the luminescent colors of the light-emitting components in the same light-emitting unit are different.

S03, forming the encapsulation layer 5;

S04, forming the first light extraction layer 7;

the first light extraction layer 7, located on the light-emitting side of the light-emitting baseplate 100, includes the plurality of first light extraction patterns, such as the first light extraction pattern 71, the first light extraction pattern 72, and the first light extraction pattern 73, and the orthographic projections of the first light extraction patterns on the light-emitting baseplate 100 cover at least part area of the light-emitting components;

In some embodiments, the isolation layer 6 may also be formed on the encapsulation layer after forming the encapsulation layer 5 and before forming the first light extraction layer 7.

In the embodiment of the present application, the isolation layer 6 is set between the encapsulation layer 5 and the first light extraction layer 7 to avoid the direct contact between the first light extraction layer 7 and the inorganic sub-layer in the encapsulation layer 5, so as to avoid the influence of the inorganic materials in the inorganic sub-layer on the material of the first light extraction layer 7 in the process of preparing the first light extraction layer 7, thus improving the yield of the first light extraction layer 7, and helping to improve the reliability of the display panel.

S05, forming the first fill layer 8;

S06, forming the color filter layer 9;

among them, the color filter layer 9 includes the plurality of filter patterns, such as the filter pattern 91, the filter pattern 92 and the filter pattern 93, and colors of the filter pattern 91, the filter pattern 92 and the filter pattern 93 are different.

In some embodiments, the black matrix layer 13 needs to be formed after forming the first fill layer 8 and before forming the color filter layer 9.

S07, forming the second light extraction layer 11 as shown in FIG. 2.

The second light extraction layer 11, located on the side of the color filter layer 9 away from the light-emitting baseplate 100, includes the plurality of second light extraction patterns, such as the second light extraction pattern 111, the second light extraction pattern 112 and the second light extraction pattern 113, and the orthographic projections of the second light extraction patterns on the light-emitting baseplate 100 are within the orthographic projections of the filter patterns on the light-emitting baseplate 100.

In some embodiments, the second fill layer 10 may also be formed on the color filter layer before forming the second light extraction layer 11 and after forming the color filter layer 9;

S08, forming the protective layer.

It should be noted that, the structures shown in FIG. 2 are drawn with the first light extraction pattern including one light regulating part T, and the second light extraction pattern including one convex lens L as an example.

In the display panel prepared by the preparation method provided in the embodiment of the present application, the light emitted by the light-emitting component in the light-emitting baseplate 100 is refracted by setting the first light extraction layer 7 on the light-emitting side of the light-emitting baseplate 100 to reduce the total reflection in the film layers, so that the light emitted by the light-emitting component is emitted by the first light extraction layer 7 as much as possible. In addition, the second light extraction layer 11 is set on the light-emitting side of the color filter layer 9. Through the second light extraction layer 11, the light emitted by the color filter layer 9 is further converged, thus reducing the amount of the light emitted from the direction parallel to the light-emitting baseplate, improving the efficiency of the light emitted from the direction perpendicular to the light-emitting baseplate, and improving the display effect of the display panel.

The above is only the specific implementation of the present application, but the scope of protection of the present application is not limited to this. Any technical personnel familiar with the technical field may easily think of changes or replacements within the scope of technology disclosed in the present application, which should be covered in the scope of protection of the present application. Therefore, the scope of protection of the present application shall be subject to the scope of protection of the claims.

The invention claimed is:

1. A display panel, comprising:

a light-emitting baseplate comprising a plurality of light-emitting components arranged in array, wherein each of the plurality of light-emitting components corresponds to one sub-pixel of one pixel of the light-emitting baseplate;

a first light extraction layer, wherein the first light extraction layer is located at a light-emitting side of the light-emitting baseplate and comprises a plurality of first light extraction patterns, and an orthographic projection of each of the plurality of first light extraction patterns on the light-emitting baseplate covers at least part of an area of merely one of the plurality of light-emitting components;

a color filter layer, wherein the color filter layer is located at a side of the first light extraction layer away from the light-emitting baseplate and comprises a plurality of filter patterns, and an orthographic projection of each of the plurality of filter patterns on the light-emitting baseplate covers an orthographic projection of one of the plurality of light-emitting components on the light-emitting baseplate; and a second light extraction layer, wherein the second light extraction layer is located at a side of the color filter layer away from the light-emitting baseplate and comprises a plurality of second light extraction patterns, and an orthographic projection of each of the plurality of second light extraction patterns on the light-emitting baseplate is within the orthographic projection of one of the plurality of filter patterns on the light-emitting baseplate;

wherein each of the plurality of first light extraction patterns comprises at least three light regulating parts, and sizes of at least two of the light regulating parts of a same first light extraction pattern in a same direction are different from each other;

each of the plurality of second light extraction patterns comprises at least one convex lens; and a quantity of the at least one light regulating part of each of the plurality of first light extraction patterns is greater than or equal to a quantity of the at least one convex lens of each of the plurality of second light extraction patterns.

2. The display panel according to claim 1, wherein among the plurality of first light extraction patterns, structures of at least part of the first light extraction patterns are different from the rest of the first light extraction patterns.

3. The display panel according to claim 2, wherein the light-emitting baseplate comprises a plurality of light-emitting units arranged in array, and each of the plurality of light-emitting units comprises the plurality of light-emitting components; and structures of the first light extraction patterns located at a light-emitting side of a same light-emitting unit are different.

4. The display panel according to claim 3, wherein the plurality of light-emitting units comprise first light-emitting components, second light-emitting components and third light-emitting components; and structures of the first light extraction patterns located at light-emitting sides of the first light-emitting components are the same, structures of the first light extraction patterns located at light-emitting sides of the second light-emitting components are the same, and structures of the first light extraction patterns located at light-emitting sides of the third light-emitting components are the same.

5. The display panel according to claim 3, wherein shapes of section graphs of the first light extraction patterns located at the light-emitting side of the same light-emitting unit are different in a direction perpendicular to the light-emitting baseplate; and/or shapes of orthographic projection graphs on the light-emitting baseplate of the first light extraction patterns located at the light-emitting side of the same light-emitting unit are different.

6. The display panel according to claim 3, wherein sizes of section graphs of the first light extraction patterns located at the light-emitting side of the same light-emitting unit are different in a direction perpendicular to the light-emitting baseplate; and/or sizes of orthographic projection graphs on the light-emitting baseplate of the first light extraction patterns located at the light-emitting side of the same light-emitting unit are different.

7. The display panel according to claim 1, wherein the orthographic projections of the plurality of first light extraction patterns on the light-emitting baseplate cover the plurality of light-emitting components, and further cover at least part area between two adjacent light-emitting components.

8. The display panel according to claim 1, wherein in a same direction, a spacing between every two adjacent first light extraction patterns is less than a spacing between every two adjacent second light extraction patterns.

9. The display panel according to claim 8, wherein luminescent colors of the plurality of light-emitting components are the same, and the spacing between every two adjacent first light extraction patterns is zero.

10. The display panel according to claim 1, wherein for the first light extraction pattern located at a light-emitting side of the light-emitting component, a size of projection shapes of the light regulating parts of the first light extraction pattern on the light-emitting baseplate in a direction is less than or equal to one third of a size of a projection shape of the light-emitting component on the light-emitting baseplate in the same direction.

11. The display panel according to claim 1, wherein each of the plurality of first light extraction patterns comprises a first surface, the first surface is disposed away from the light-emitting baseplate; and the first surface comprises a surface formed by a combination of a plurality of curve surfaces or a surface formed by a combination of a plurality of planes.

12. The display panel according to claim 11, wherein the at least one light regulating part comprises a combination of one or more of a semi-ellipsoid, a hemisphere and a triangular pyramid.

13. The display panel according to claim 1, wherein the display panel further comprises a first fill layer, the first fill layer is located between the first light extraction layer and the color filter layer, a refractive index of a material of the first light extraction layer is greater than a refractive index of a material of the first fill layer, and an absolute value of a difference between the two refractive indexes is greater than or equal to 0.5.

14. The display panel according to claim 1, wherein a refractive index of a material of the first light extraction layer is greater than a refractive index of a material of the second light extraction layer, and an absolute value of a difference between the two refractive indexes is greater than or equal to 0.5.

15. The display panel according to claim 1, wherein the light-emitting baseplate comprises an encapsulation layer covering the plurality of light-emitting components, an isolation layer located at a side of the encapsulation layer away from the plurality of light-emitting components; a refractive index of a material of the encapsulation layer is greater than a refractive index of a material of the isolation layer, and the refractive index of the material of the encapsulation layer is greater than a refractive index of a material of the first light extraction layer.

16. The display panel according to claim 1, wherein the light-emitting baseplate comprises an encapsulation layer covering the plurality of light-emitting components, an isolation layer located at a side of the encapsulation layer away from the plurality of light-emitting components; and an absolute value of a difference between the refractive index of the material of the encapsulation layer and the refractive index of the material of the first light extraction layer is less than or equal to 0.01, and an absolute value of a difference between a transmittance of the material of the encapsulation layer and a transmittance of the material of the first light extraction layer is less than or equal to 1%.

17. The display panel according to claim 1, wherein the display panel further comprises a second fill layer and a protective layer, the second fill layer is located between the second light extraction layer and the color filter layer, the protective layer covers the second light extraction layer, and a refractive index of a material of the second light extraction layer is greater than a refractive index of a material of the protective layer.

18. A display device, comprising the display panel according to claim 1.

* * * * *